United States Patent [19]
Peng et al.

[11] Patent Number: 5,773,862
[45] Date of Patent: Jun. 30, 1998

[54] FLOATING GATE FGPA CELL WITH SEPARATED SELECT DEVICE

[75] Inventors: Jack Zezhong Peng, San Jose; Robert M. Salter, III, Saratoga; Robert J. Lipp, Los Gatos, all of Calif.

[73] Assignee: Zycad Corporation, Fremont, Calif.

[21] Appl. No.: 704,853

[22] Filed: Aug. 27, 1996

[51] Int. Cl.$^6$ .................................................. H01L 29/788
[52] U.S. Cl. ........................................... 257/316; 257/321
[58] Field of Search .................................... 257/314, 315, 257/316, 321; 365/185

[56] References Cited

U.S. PATENT DOCUMENTS 5,569,945  10/1996  Hong ....................................... 257/316

*Primary Examiner*—Mark V. Prenty
*Attorney, Agent, or Firm*—Townsend and Townsend and Crew LLP

[57] ABSTRACT

The present invention provides for a programming portion of an FPGA cell of an integrated circuit and a process of manufacturing the programming portion. The programming portion has an EPROM transistor and a separated select transistor with the gate of the select transistor connected to the control gate of the EPROM transistor. Both transistors share a common N+ source/drain region, which is self-aligned with the gates of both transistors. With the select transistor separated from the EPROM transistor and the self-aligned common N+ region, the threshold voltage $V_T$ of the select transistor can be set precisely. This allows good control over the programming voltage for the control gate of the EPROM transistor and the time to program the floating gate of the EPROM transistor.

10 Claims, 5 Drawing Sheets

FLOATING GATE FGPA CELL WITH SEPARATED SELECT DEVICE

BACKGROUND OF THE INVENTION

The present invention is related to field programmable integrated circuits, and more particularly, to Field Programmable Gate Arrays (FPGAs).

Typically, an FPGA has an array of logic elements and wiring interconnections with many thousands, or even hundreds of thousands, of programmable interconnects so that the FPGA can be configured by the user into an integrated circuit with defined functions. Each programmable interconnect can connect two circuit nodes in the integrated circuit to make (or break) a wiring interconnection, or to set the function or functions of a logic element.

FPGAs use either memory cells or antifuses for the programmable switches. The memory cells are reprogrammable and antifuses are programmable only once. In U.S. application Ser. No. 08/270,714, entitled, "A GENERAL PURPOSE, NON-VOLATILE REPROGRAMMABLE SWITCH," filed Jul. 5, 1994 by Robert J. Lipp, Richard D. Freeman, Robert U. Broze, John M. Caywood, and Joseph G. Nolan, III, and assigned to the present assignee, a new memory-type of programmable interconnect is disclosed. The described FPGA programmable interconnect cell has a non-volatile memory (NVM) cell, which is reprogrammable, to provide a general purpose switching element to randomly interconnect the FPGA wiring and circuit elements.

The present invention provides for an improvement in the disclosed programmable interconnect. In particular, the process of manufacturing the programming element of the programmable interconnect is improved. The resulting programming portion, an EPROM transistor cell, has improved electrical operating parameters.

SUMMARY OF THE INVENTION

The present invention provides for a programming portion of an FPGA cell in a substrate of an integrated circuit. The programming portion has a first-type dopant region in the substrate, which region extends to a principal surface of the substrate. First, second and third second-type dopant regions which extend to the principal surface lie in the first-type dopant region. A floating gate electrode lies over a first channel region, which separates the first and second second-type dopant regions, at the principal surface. A control gate electrode lies over the floating gate. Finally, a select transistor gate electrode lies over a second channel region, which separates the second and third second-type dopant regions, at said principal surface. The select transistor gate electrode is connected to the control gate electrode.

DETAILED DESCRIPTION OF PREFERRED EMBODIMENTS

Figure 1:
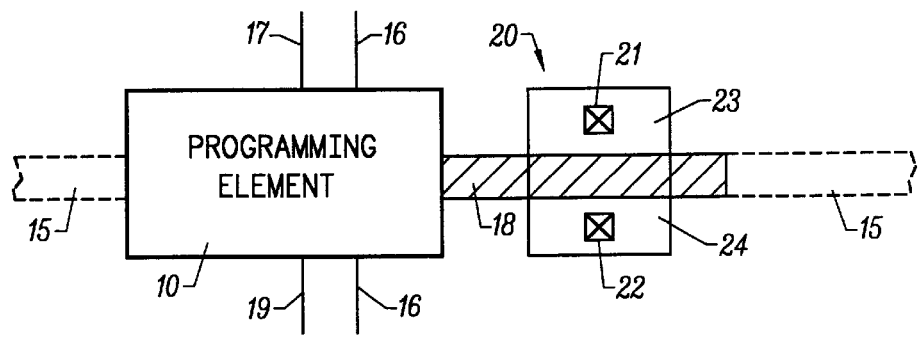
FIG. 1 is a representative top view of a programmable interconnect.

FIG. 1 illustrates the general organization of a programmable interconnect cell described in the above-mentioned patent application. The cell has two elements, a programming element 10 and a switching element 20. The switching element 20 is illustrated by a simplified integrated circuit layout representation and the programming element 10 by a black box representation.

The switching element 20 can be considered a simple MOS transistor having source/drains regions 23 and 24 separated by a gate. Depending upon the charge of the gate, the source/drains regions 23 and 24 are either connected to, or isolated from, each other. A source/drain region 23 of the switching element 20, formed by an impurity diffusion into the substrate of the integrated circuit, is connected by a contact 21 to other nodes of the integrated circuit. Similarly, the source/drain region 24, another impurity diffusion into the substrate of the integrated circuit, is connected to other nodes through a contact 22. Thus the switching element 20 can connect (or disconnect) two circuit nodes in the integrated circuit to make (or break) a wiring interconnection, or to set the function or functions of a logic element.

The switching element 20 is connected to the programming element 10 which sets the state of the switching element. As shown in FIG. 1, a control gate 15 and a floating gate 18 physically and electrically connect the switching and programming elements 20 and 10. The control gate 15 is shown by dotted lines where the gate 15 continues beyond the floating gate 18. The control gate 15 overlies the floating gate 18 in the area of the switching element 20. The control gate 15 continues into the programming element 10, and to other circuitry on the integrated circuit (not shown).

The programming element 10 adds or subtracts electrical charges from the floating gate 18 which it shares with the switching element 20. The floating gate 18 is not directly connected to any other circuit element and stores the programmed state of the programmable interconnect by the presence or lack of electrical charges on the floating gate 18. To operate, the programming element 10 is connected to programming control lines 17, 16, 19 and the control gate 15. As shown by the FIG. 2 schematic representation of the programmable interconnect, the programming element 10 itself is formed by an EPROM transistor 32 and an FN erase device 31, each of which is coupled to the floating gate 18. The EPROM transistor 32 forms the programming portion and the FN erase device 31 forms the erasing portion of the programming element 10. In other words, the EPROM transistor 32 "programs" the programmable interconnect and the FN device 31 "erases" the programmable interconnect. Thus, the FN erase device 31 turns on the programmable switch 20 and the EPROM transistor 32 turns off the programmable switch 20.

In the context of NMOS NVM technology, an NVM transistor is erased or programmed by respectively adding or removing electrons from its floating gate. For an n-channel (NMOS) NVM transistor, if electrons are removed from the floating gate, the charge on the gate becomes more positive, turning the transistor on, i.e., reducing the impedance and permitting current to flow across the source-drain terminals of the transistor. This state is commonly referred to as the erased state. If electrons are added, the charge becomes more negative, programming the device by turning the transistor off, i.e., creating a high impedance between the source-drain terminals and inhibiting current flow. These responses make the NVM transistor act like switch. When the transistor is on, the switch is closed; when the transistor is off, the switch is open. For p-channel MOS (PMOS) NVM transistors, the response is similar, except that the polarity of the gate voltage controlling whether the transistor turns on or off is reversed.

Figure 2:
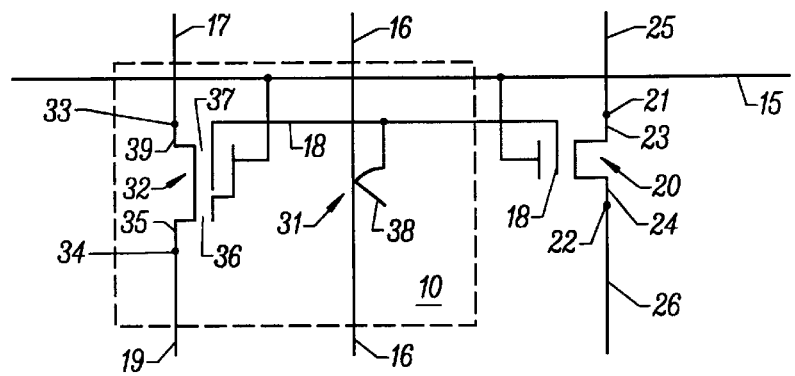
FIG. 2 is a schematic circuit diagram of the programmable interconnect of FIG. 1.
Figure 3:
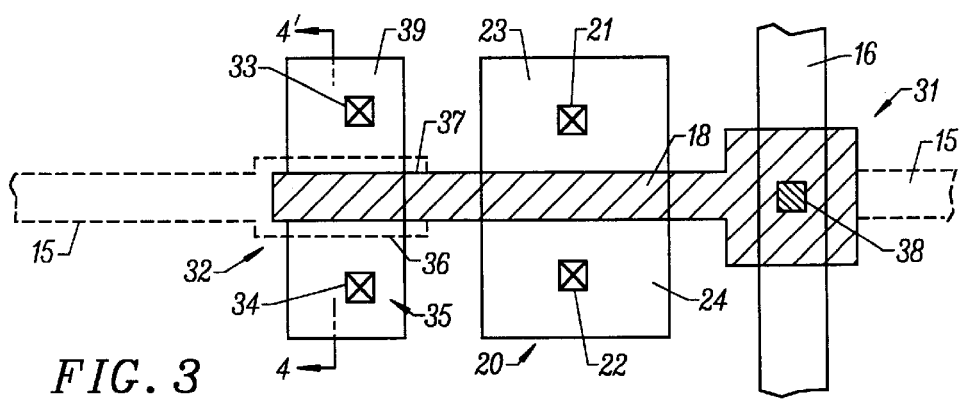
FIG. 3 is detailed top view of the programmable interconnect of FIG.. 2.

FIG. 3 is a top view of an integrated circuit layout of the programmable interconnect diagrammed in FIG. 2. It should be noted that in the drawings the same reference numerals are used for the same elements in different drawing formats to facilitate a better understanding of the invention. In this layout the switching element 20 is shown between the FN device 31 on the right and the EPROM transistor 32. At least in the region of the FN device 31, the programming control line 16 is represented by a substrate diffusion shown by a solid line. The diffusion underlies the floating gate 18 in the form of a polysilicon layer shaded by diagonal lines. The polysilicon floating gate 18 is, in turn, under the control gate 15, a polysilicon layer running horizontally in the drawing and outlined by dotted lines in areas removed from the floating gate 18. Above the floating gate 18, the control gate 15 is coextensive with the gate 18.

The FN tunnel region 38 in the FN device 31 is a thin oxide region underlying the floating gate 18 but overlying diffusion 26. The region 38 is represented by a solid square in the drawing. On the far left side of the FIG. 3 is the EPROM transistor 32. Note that the structure of the EPROM transistor is similar to that of the NMOS transistor forming the switching element 20, except that the control gate 15 extends beyond the floating gate 18 on two sides of the transistor to create the gate region 36. This figure clearly shows how the floating gate 18 is shared between all three elements, the switching element 20 and the two devices of the programming element 10, the FN tunnel element 31 and the EPROM transistor 32.

The voltage on the floating gate 18 is manipulated during programming and erase operations by applying a voltage to the control gate 15 which overlies the floating gate 18 and is capacitively coupled to it. The floating gate 18 is erased by electrons tunneling across an FN tunnel region 38 from the gate 18 to a programming control line 16 when a high positive voltage, with respect to the gate 18, is applied to the line 16. The control gate 15 is typically held at ground voltage during this operation to ensure that the voltage on the gate 18 is near ground potential. The voltage on the floating gate 18 is erased to a positive voltage with respect to ground.

To overcome the selection problem in charging the floating gate 18, the present invention has a gate region 36 in the EPROM programming transistor 32. The floating gate 18 is programmed by adding electrons to it by channel hot electron (CHE) injection in the EPROM transistor 32. In a programming operation, the control gate 15 is raised to a high voltage to turn on the transistor 32. The gate region 36, acting as a select device, is directly controlled by the control gate 15 while the gate region 37 of the transistor 32 is controlled by the floating gate 18. Both regions 36 and 37 are activated by a positive voltage with respect to the source region 35 of the transistor 32. As the floating gate 18 is capacitively coupled to the control gate 15, the rise in voltage on the gate 15 further raises the voltage on the floating gate 18 to ensure that the transistor 32 is turned on in the region 37 also. A high voltage on the programming control line 17 and a lower voltage on the line 19 causes a current to flow through the transistor 32, creating hot electrons, some of which are captured by the floating gate 18. This mechanism is termed channel hot electron (CHE) injection. These captured hot electrons charge the floating gate 18 negatively.

The charge on the gate 18 becomes so negative that, given sufficient time, the region 37 of transistor 32 is turned off and the transistor 32 stops conducting current. If sufficient time is allowed to fully charge the floating gate 18, its final charge is primarily a function of the voltage on the control gate 15 and the coupling ratio between the control gate 15 and the floating gate 18 (i.e., the percentage of all capacitance of the gate 28 which is coupled to the gate 25). CHE programming is a well understood phenomena and is not described further.

The programming control lines 17 and 19, and the control gate 15 are further connected to other programmable interconnects in the integrated circuit. Each EPROM transistor 32 typically is embedded in an orthogonal matrix, or array, of such devices which are uniquely addressed and selected by the gates 15 and programming control lines 17 and 19 using well known memory addressing technology. The gate region 36 provides for the unique row address selection by the control gate 15. If the gate 15 is driven low, the transistor 32 is not activated, regardless of the voltage on the floating gate 18. Selectively driving the programming control line 17 provides for column address programming selection.

In a similar fashion, the programming control line 16 is also connected to other FN tunnel elements of other programmable interconnects in the integrated circuit. This permits erasing operations to be performed on all of the programmable interconnects at the same time.

Figure 4A:
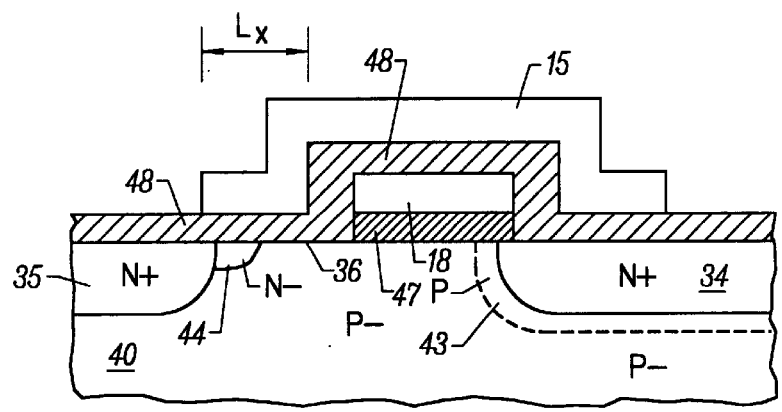
FIGS. 4(a)–4(b) is a cross-sectional sideview of the programming element of the programmable interconnect of FIG. 3.

FIG. 4A is a cross-sectional side view of the EPROM transistor 32 along line 4—4' in FIG. 3. As shown in enlarged scale, the source region 35 of heavily doped N-type dopants is separated by channel regions 36 and 37 at the surface of the substrate 40 from the heavily doped N+ region 39. The region 39 is the drain region of the NVM transistor. Over the channel region 36 is a portion of the control gate 15, while the floating gate 18 lies over the region 37. A first gate oxide layer 47 separates the channel region 37 from the floating gate 18. A second gate oxide layer 48 separates a portion of the control gate 15 from the channel region 36. The gate oxide layer 48 also separates the floating gate 18 from the control gate 15.

Next to the source region 35 in the channel region 36, a lightly doped N- region 44 helps avoid breakdown at the source region 35. Around the drain region 39 is a P-type region 43 which aids in the programming of the floating gate 18. The more heavily doped region 43, as compared to the P-region of the substrate 40, narrows the space charge region formed by the drain 39 and the P-type substrate 40. This narrowing of the space charge region increases the strength of the electric field in this region to enhance CHE effects so that the electrons traveling from the source 35 to the drain 39 are more easily capable of traveling through the oxide layer 47 to the floating gate 18. The remainder of the channel regions 36 and 37 are formed by the P- substrate 40 (or at least a P-doped region where the EPROM transistor 32 is formed). The P-region ensures that the threshold voltage is low so that the regions 36 and 37 can be inverted, or turned on, for electrons to travel from the source 35 to the drain 39 during programming.

Figure 4B:
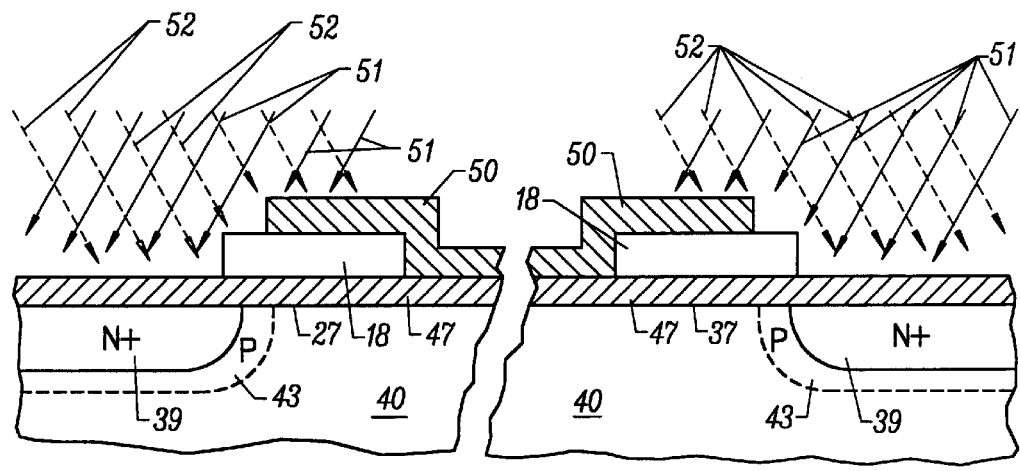

To form the P-regions 43 around the drain regions 39, high energy angled implants of P-type dopants are performed. FIG. 4B illustrates the high energy implant steps, which are performed prior to the formation of the control gate 15. Two EPROM transistors of different programmable interconnects are arranged "back-to-back" so that their floating gates 18 are covered by a patterned resist layer 50. Then, high energy angled implants of P-type dopants are performed. FIG. 4B illustrates the same high energy implant steps. Solid arrows 51 indicate implants forming the region 43 under the control gate 18 for the EPROM transistor on the right side of the drawing. Dotted arrows 52 indicate the implant step to form the P region 43 for the left hand side EPROM transistor shown in FIG. 4B. Since the EPROM transistors can be arranged in all four directions on the surface of the integrated circuit, four high energy implant steps are performed in four directions. In FIG. 4B, the remaining two implant steps are angled into and out of the plane of the drawing.

The implant step which forms the P region 43 for the channel region 37 creates are problems. First, the high energy implant damages the gate oxide layer 47 beneath the floating gate 18. The damage to the floating gate oxide creates paths for leakage of the charge carriers off the floating gate 18 back into the substrate 40. This undesirably lessens the long term reliability of the programmable interconnect. Secondly, the high energy implant step lowers the breakdown voltage around the region 43. To get each of the EPROM transistors properly implanted under the floating gate 18, each transistor receives four times as much of implants as required.

Finally, it is difficult to control the threshold voltage $V_T$ of the select device, i.e., the field effect device formed by the control gate 15 and the channel region 36. The $V_T$ has a strong influence upon the programming voltage for the control gate 15 and the time to program the floating gate 18. In the described structure, the substrate region 40 (or at least the region in the substrate in which the EPROM transistor 32 is formed) is a P− region to keep $V_T$ low. However, the $V_T$ is determined not only by dopant levels in the substrate 40 but also by the thickness of the second gate oxide layer 48. This oxide thickness has a strong influence upon VT. The problem is that the thickness of the second gate oxide layer not only defines the distance the control gate 15 is removed from the channel region 36, but also how far laterally the control gate 15 is removed from the channel region 37 due to the placement of the second gate oxide layer 48 along the sides of the control gate 15. Also, due to misalignment of the polysilicon 2 layer, the control gate 15, with respect to the polysilicon 1 layer, the floating gate 18, the select device channel length (shown as Lx in FIG. 4A) can vary by ±0.3 m. This can cause programming voltages and times to vary widely from cell to cell.

Figure 5:
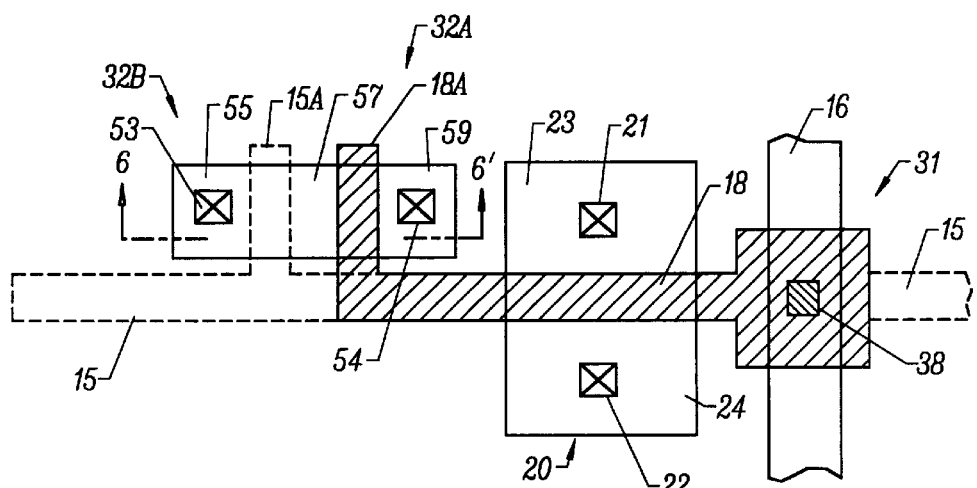
FIG. 5 is a top view of an improved programming element according to the present invention.

The present invention avoids these problems. The EPROM transistor 32 shown in FIGS. 3 and 4 is replaced by an EPROM transistor 32A and a separated select device 32B, i.e., there are effectively a select transistor 32B and a charge storage transistor 32A. As shown in FIG. 5, the end of the floating gate 18 is modified to form a right angle projection from the rest of the floating gate 18. This projection forms the floating gate 18A for the charge storage transistor 32A. Likewise, the control gate 15 has two extensions 15A which parallel to the floating gate extension 18A. One control gate extension overlies the floating gate extension 18A and the other control gate extension is displaced from the floating gate extension 18A. The displaced extension 15A forms a control gate for the select transistor 32B. A semicompleted cross-sectional view in FIG. 6I illustrates the EPROM transistor 32A and the select transistor 32B.

Returning to FIG. 5, the source region 55 is formed to the left of the control gate 15A with a contact region 53 to provide a connection node to the source region of the select transistor 32B. Likewise, a drain region 59 is provided to the right of the floating gate extension 18A with a contact region 54 to provide a connection node to the drain region of the EPROM transistor 32A. A source/drain region 57 lies between the two gates of the two transistors 32A and 32B.

FIGS. 6A–6I are cross-sectional views of the EPROM transistor 32A and the select transistor 32B at various stages of manufacture along line 6—6' in FIG. 5. In passing, it should be noted that the drawings are not drawn to scale.

First, a P region having a peak concentration illustrated by a region 79 is created in a P− substrate 40 (or at least a P− region in which the EPROM 32A and select transistor 32B are to be formed). The net P concentration is about $2 \times 10^{16}$ dopants per cubic centimeter. The P region helps isolate each EPROM 32A and select transistor 32B during high voltage programming and erasing operations.

Figure 6A:
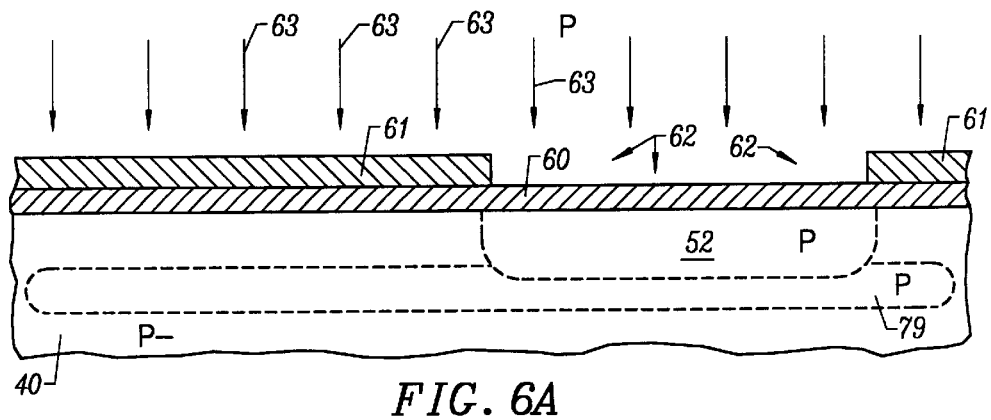
FIGS. 6A–6J are cross-sectional sideviews of the improved programming element of FIG. 5 at various stages of manufacture according to the present invention.

Then, as shown in FIG. 6A, a P region 52 is formed where the EPROM transistor 32A is to be located. While the doping of the P− substrate 40 sets the threshold voltage of the select transistor 32B, i.e., the voltage to invert the channel region under the gate extension 15A, the doping of the P region 52 defines the space charge region for the drain region to be formed for CHE charging of the floating gate 18A. The region 52 is formed by an oxide layer 60 which is covered by a photoresist layer 61. By standard photolithographic techniques, an aperture 62 is formed in the photoresist layer 61. Arrows 63 illustrate the implants of ions into the substrate 40 to form the P region 52 to a net concentration of about $5 \times 10^{17}$ dopants per cubic centimeter.

Figure 6B:
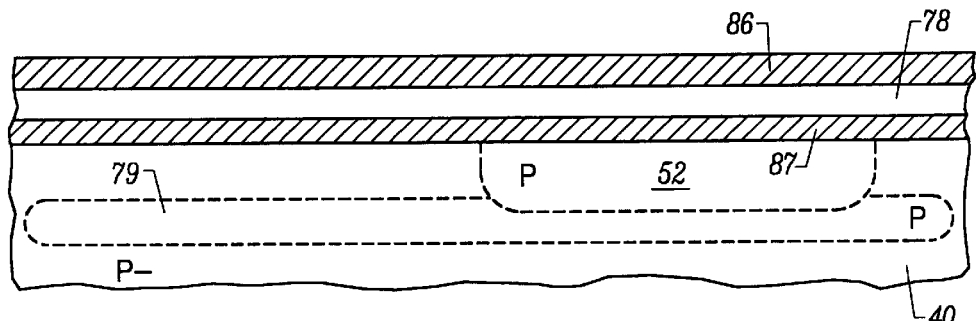

The photoresist layer 61 and the oxide layer 60 are then removed and a first gate oxide layer 87 is then formed over the substrate 40. A thickness of approximately 100–180 Å has been found to be effective. This is followed by a first polysilicon layer 78 which forms the floating gate 18 and extension 18A. A thin triple layer 86 of oxide/nitride/oxide (ONO) of approximately 300 Å is then deposited. The results of these process steps are shown in FIG. 6B.

Figure 6C:
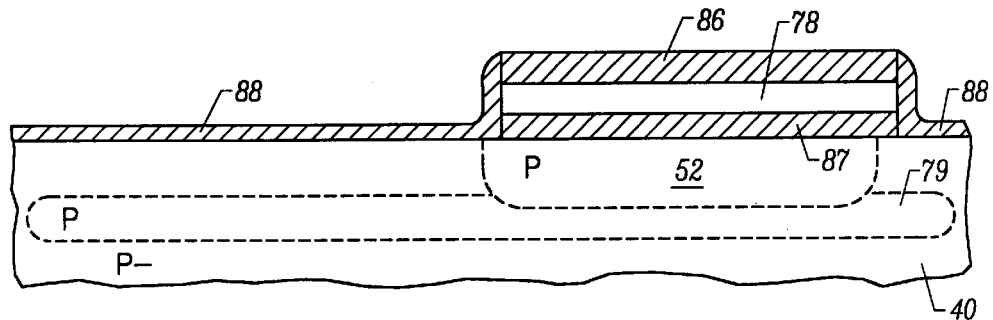

Then by standard photolithographic techniques, the first polysilicon layer 78, the first gate oxide layer 87 and the ONO layer 86 are defined over the P region 52. Then the exposed sides of the polysilicon layer 78 and the exposed surface of the substrate 40 are then thermally oxidized to grow an oxide layer 88. The ONO layer 86 blocks oxidation from the top of the first polysilicon layer. The oxide layer 88 has a sidewall thickness of 500–600 Å and a thickness of 200–400 Å on the surface of the substrate 40. This is shown in FIG. 6C. The oxide layer 88 forms the second gate oxide layer for the select transistor, while the ONO layer 86 forms the oxide layer between the floating gate and control gate of the EPROM transistor to be formed.

Figure 6D:
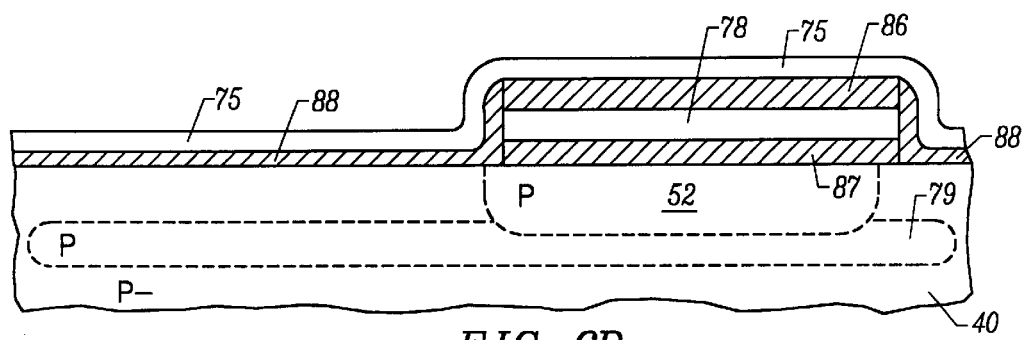
Figure 6E:
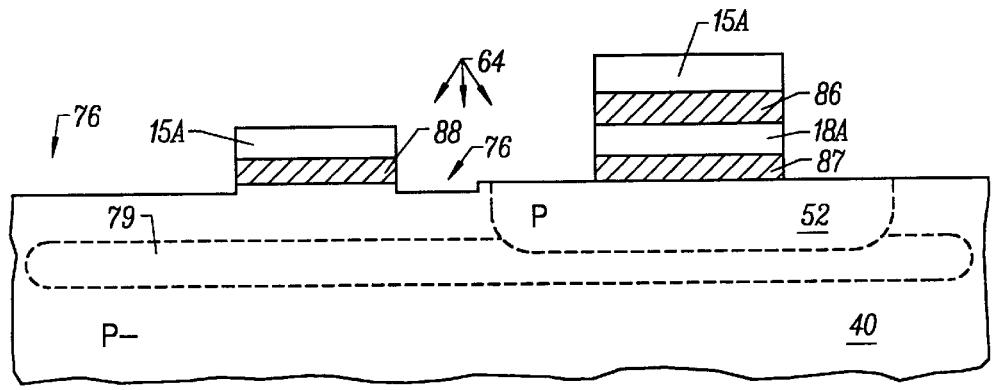
Figure 6F:
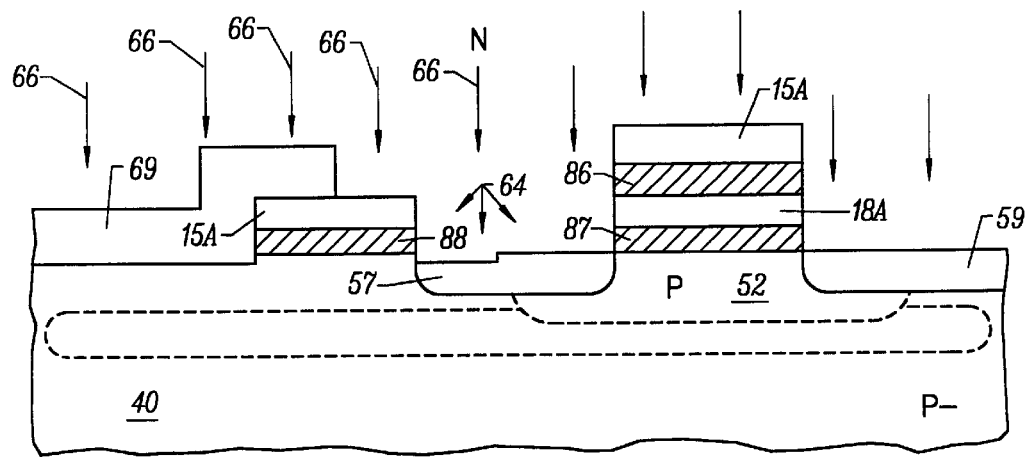

The results of the deposition of a second polysilicon layer 75 is shown in FIG. 6D. By standard photolithographic and etching steps, the second polysilicon layer 75 is defined into the gate electrode extensions 15A for the select transistor 32B and for the control electrode layer of the non-volatile memory cell 32A, as shown in FIG. 6E. Likewise, the gate oxide layer 88 for the select transistor 32B, and the second gate electrode oxide layer 86, the floating gate layer 18A, and the first gate oxide layer 87 for the EPROM memory cell 32A are also defined.

As shown on the right side of FIG. 6E, the control gate 15A, the second gate oxide layer 86, the floating gate 18A and the first gate oxide layer 87 are defined to be self-aligned, i.e., they are laterally coextensive. These gates 15A, 18A and oxide layers 87, 86 which form the EPROM transistor 32A are separated from the gate 15A and its gate oxide layer 88 which form the select transistor 32B by an aperture 64. Note that a trench 76 is formed in the surface of the substrate 40 around the select transistor 32B. The trench 76 is created by the difference in etching through the polysilicon layer 75, ONO layer 86, first polysilicon layer 78 and first gate oxide layer 87 of the EPROM transistor 32A to be formed, and the polysilicon layer 75, and oxide layer 88 of the transistor 32B.

Then a photoresist layer 69 is deposited and defined to cover the source/drain region of the select transistor 32B to be formed opposite the aperture 64. This is followed by a source-drain ion implant of arsenic as shown by arrows 66 in FIG. 6F. A net concentration of N-type dopants of about $4\times10^{15}$ dopants is created in regions 57 and 59 at the surface of the substrate 40. These regions 57 and 59 are self-aligned and defined by the gates 15A and its underlying layers of the EPROM and select transistors 32A and 32B. It should be especially noted that the N region 57 avoids the alignment problems between the polysilicon layers 1 and 2 which form the floating gate and control gate respectively, previously described with respect to FIG. 4A.

Figure 6G:
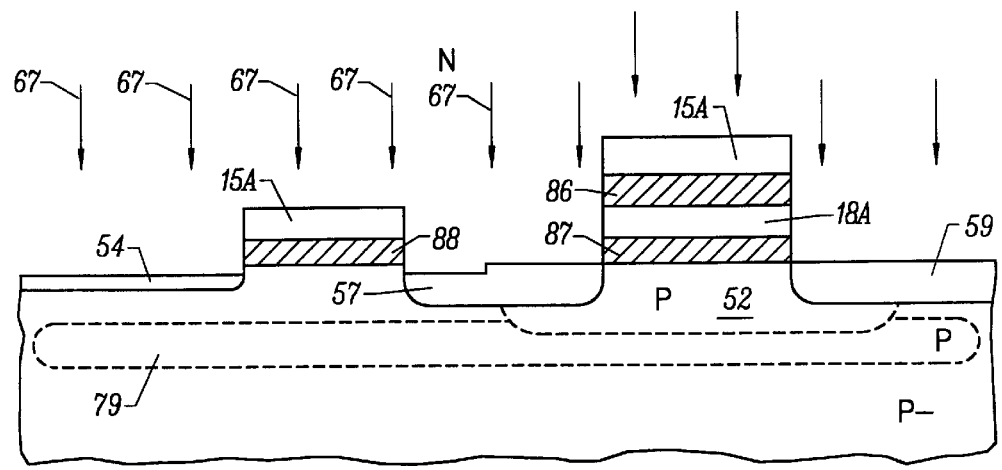

The photoresist layer 69 is then removed and a low-energy implant of phosphorous is performed, as illustrated by arrows 67 in FIG. 6G. A self-aligned N-type region 54 is formed at the surface of substrate 40 where the photoresist layer 69 had been located.

Figure 6H:
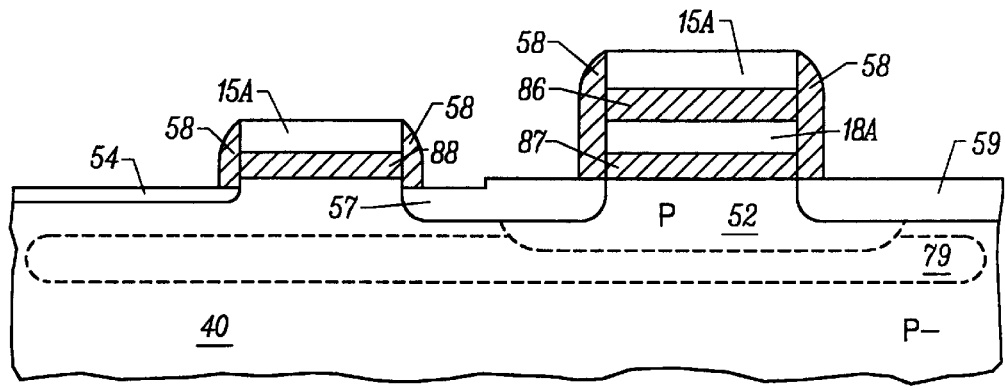
Figure 6I:
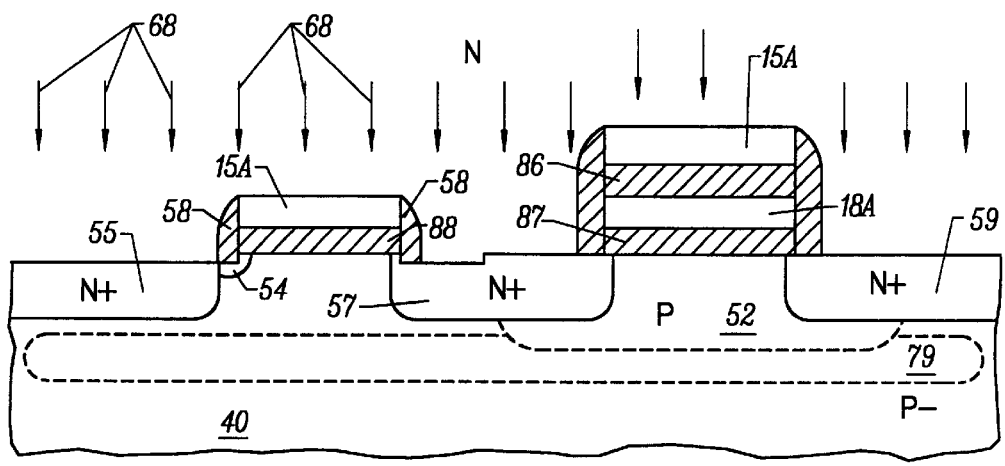

An oxide layer of approximately 2000 Å is deposited over the surface of the substrate 40. Then, by standard side wall spacer techniques, the oxide layer is then removed by reactive ion etching to form sidewall spacer regions 58 along the sides of the gate electrode layer 15A and second gate oxide layer 88 of the select transistor 32B, and the sides of the gate electrode layer 15A, second gate oxide layer 86, the floating gate layer 18A and first gate oxide layer 87 of the EPROM transistor 32A. The sidewall regions 58 are approximately $0.2\mu$ thick. This structure is illustrated by FIG. 6H.

This is followed by another source/drain ion implantation step of N-type dopants, as shown in FIG. 6I. Arrows 68 show an arsenic implant to form an N+ region 55 with a net concentration of $5\times10^{15}$ dopants per cubic centimeter. The remaining portion of the N region 54 becomes a lightly doped drain (LDD) region for the N+ region 55 for the select transistor 32B. The N+ region 53 acts as a source region for the charge storage transistor having the drain region 59. The P region 52 is doped such that the maximum channel hot electrons (CHE) charge, i.e., program, the floating gate 18A.

Figure 6J:
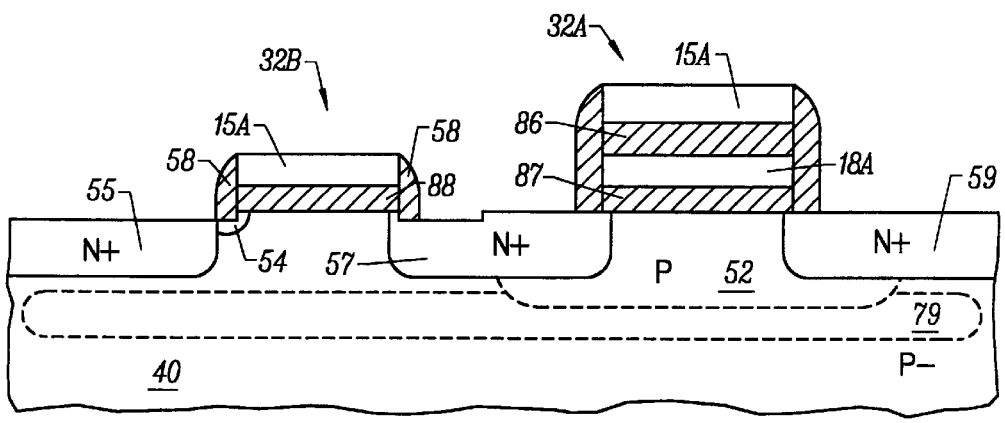

The nearly completed EPROM transistor 32A and its select transistor 32B are shown in FIG. 6J. The overlying protection layers and connection layers to the source and drain regions are not shown. Since the EPROM transistor 32A and the select transistor 32B are formed independently of each other, the parameters of each device are easily optimized. The source/drain regions 55 and 57 of the select transistor 32B are self-aligned. These factors allow the $V_T$ of the select transistor 32B is set to be in the range of 0.1–0.5 volts, while the $V_T$ of the EPROM transistor 32A is set approximately to be 2 volts. Programming of the EPROM transistor 32A can therefor be performed very quickly. Since the first gate oxide layer 57 is undamaged, leakage from the floating gate 18A is minimized and a programmed state of the EPROM transistor 32A is protected.

Thus with a straightforward manufacturing process the present invention provides for the programming portion of an FPGA cell which can be programmed quickly and efficiently.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. A programming portion of an FPGA cell in a substrate of an integrated circuit, comprising
   a first-type dopant region in said substrate and extending to a principal surface of said substrate;
   first, second and third second-type dopant regions in said first-type dopant region and extending to said principal surface;
   a floating gate electrode over a first channel region at said principal surface, said first channel region separating first and second second-type dopant regions;
   a control gate electrode over said floating gate; and
   a select transistor gate electrode over a second channel region at said principal surface, said second channel region separating said second and third second-type dopant regions, said select transistor gate electrode connected to said control sate electrode, wherein said second second-type region is substantially defined by an edge of said floating gate electrode and an edge of said control gate electrode.

2. The programming portion of the FPGA cell of claim 1 wherein said floating gate electrode and said control gate electrode are laterally coextensive over said first channel region.

3. The programming portion of the FPGA cell of claim 2 wherein a single polysilicon layer comprises said control gate electrode and said select transistor gate electrode.

4. The programming portion of the FPGA cell of claim 1 further comprises a first gate oxide layer between said floating gate electrode and said first channel region, a second gate oxide layer between said select transistor gate electrode and said second channel region, said first gate oxide layer and said second gate oxide layer each having thicknesses unrelated to the thickness of the other gate oxide layer so that operations in said first channel and said second channel are optimized.

5. The programming portion of the FPGA cell of claim 4 wherein said first gate oxide layer has a thickness of approximately 100–180 Å and said second gate oxide layer has a thickness of approximately 200–400 Å.

6. In an FPGA cell having an interconnect transistor having first and second source/drains connected to first and second circuit nodes respectively, a floating gate electrode for turning said interconnect MOS transistor off and on responsive to the amount of charge on said floating gate electrode, and a portion for programming charge onto said floating gate electrode, said portion comprising
   a first-type dopant region in said substrate and extending to a principal surface of said substrate;
   first, second and third second-type dopant regions in said first-type dopant region and extending to said principal surface;
   said floating gate electrode extending over a first channel region at said principal surface, said first channel region separating first and second second-type dopant regions;
   a control gate electrode over said floating gate electrode; and a select transistor gate electrode over a second channel region at said principal surface, said second channel region separating said second and third second-type dopant regions, said select transistor gate electrode connected to said control gate electrode, wherein said second second-type region is substantially defined by an edge of said floating gate electrode and an edge of said control gate electrode.

7. The programming portion of the FPGA cell of claim 6 wherein said floating gate electrode and said control gate electrode are laterally coextensive over said first channel region.

8. The programming portion of the FPGA cell of claim 7 wherein a single polysilicon layer comprises said control gate electrode and said select transistor gate electrode.

9. The programming portion of the FPGA cell of claim 6 further comprises a first gate oxide layer between said floating gate electrode and said first channel region, a second gate oxide layer between said select transistor gate electrode and said second channel region, said first gate oxide layer and said second gate oxide layer each having thicknesses unrelated to the thickness of the other gate oxide layer so that operations in said first channel and said second channel are optimized.

10. The programming portion of the FPGA cell of claim 9 wherein said first gate oxide layer has a thickness of approximately 100–180 Å and said second gate oxide layer has a thickness of approximately 200–400 Å.

* * * * *